(12) United States Patent
Jang

(10) Patent No.: US 7,821,317 B2
(45) Date of Patent: Oct. 26, 2010

(54) CLOCK GENERATING APPARATUS

(75) Inventor: Young-chan Jang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 6 days.

(21) Appl. No.: 12/137,595

(22) Filed: Jun. 12, 2008

(65) Prior Publication Data
US 2009/0009228 A1 Jan. 8, 2009

(30) Foreign Application Priority Data
Jul. 2, 2007 (KR) ........................ 10-2007-0066167

(51) Int. Cl.
*H03K 3/00* (2006.01)
(52) U.S. Cl. .................. 327/295; 327/291; 327/158; 327/161
(58) Field of Classification Search .......... 327/155, 327/156, 158, 159, 161, 291, 292, 295–298
See application file for complete search history.

(56) References Cited

U.S. PATENT DOCUMENTS

| | | | | |
|---|---|---|---|---|
| 5,087,829 A | * | 2/1992 | Ishibashi et al. ............ | 327/152 |
| 6,535,043 B2 | * | 3/2003 | Chen ............................ | 327/291 |
| 7,423,466 B2 | * | 9/2008 | Sareen et al. ................ | 327/175 |
| 7,532,050 B2 | * | 5/2009 | Haerle et al. ................. | 327/158 |
| 2006/0273836 A1 | | 12/2006 | Lin | |

FOREIGN PATENT DOCUMENTS

| | | |
|---|---|---|
| JP | 2002-163034 | 6/2002 |
| KR | 1020070036549 A | 4/2007 |

* cited by examiner

*Primary Examiner*—An T Luu
(74) *Attorney, Agent, or Firm*—Volentine & Whitt, P.L.L.C.

(57) ABSTRACT

A clock generating apparatus includes a clock generator and a controllable delay line. The clock generator receives an external clock signal and generates multiple clock signals having different phases by delaying the external clock signal. The controllable delay line receives one of the multiple clock signals as a first clock signal and delays the first clock signal by a first interval in response to an externally applied control signal. The delayed first clock signal is input to the clock generator.

23 Claims, 13 Drawing Sheets

CLOCK GENERATING APPARATUS

CROSS-REFERENCE TO RELATED PATENT APPLICATION

A claim of priority is made to Korean Patent Application No. 10-2007-0066167, filed on Jul. 2, 2007, the subject matter of which is hereby incorporated by reference.

BACKGROUND OF THE INVENTION

1. Field of the Invention

The present invention relates to a clock generator, and more particularly, to a clock generator for generating multiple clock signals having different phases.

2. Description of the Related Art

In order to test the reliability of a semiconductor device, a bit error rate (BER) is measured. For example, a dynamic random access memory (DRAM) restores a signal received from an external device (a measuring device of a memory controller) and transmits the restored signal back to the measuring device, or operations of an interface circuit between a transmitter and a receiver are verified by decision in a DRAM chip. As a method of testing the bit error rate, the DRAM receives and outputs data applied from the external device to test whether the DRAM can detect and output the received data. The external device used to measure the bit error rate may be automated test equipment (ATE).

FIG. 1A is a block diagram illustrating a conventional device for measuring bit error rate.

Referring to FIG. 1A, data signal S_DATA output from ATE device 110 is input to DRAM 101. The ATE device 110 also outputs a clock signal S_CLK needed to observe the data signal S_DATA and a waveform of the data signal. Phase and magnitude of the clock signal S_CLK are swept by very small values, and clock signals S_CLKs having different phases and magnitudes are continuously output.

The DRAM 101 receives, detects and outputs the data S_DATA. A signal detected by and output from the DRAM 101 is observed by an error checker (e.g., denoted by reference numeral 115 in FIG. 1B) in the DRAM 101 or the ATE device 110. The error checker 115 in the DRAM 101 or the ATE device 110 determines whether the DRAM 101 properly receives and outputs a signal that the DRAM 101 initially transmits.

FIG. 1B is a block diagram illustrating the measuring device of FIG. 1A, in detail.

Referring to FIG. 1B, the data S_DATA output from the ATE device 110 is transmitted to the DRAM 101. The ATE device 110 internally generates clock signal CLK and outputs the clock signal S_CLK, which is generated by delaying the clock signal CLK by a predetermined delay amount in delay line 113.

The DRAM 101 may include error checker and counter 115. Alternatively, the error checker 115 may be included in an external tester. The error checker and counter 115 may be any type of element for detecting data transmission errors. The bit error rate test is performed when the ATE device 110 receives the S_DATA, including a predetermined offset voltage, and the clock signal S_CLK which is precisely phase-controlled, and the error checker and counter 115 observes a waveform of a signal output according to the data signal S_DATA and the clock signal S_CLK.

FIG. 2A is a view illustrating an initial measuring process of the device for measuring the bit error rate in FIG. 1B.

A curve 201 is a waveform of a data signal measured by a front end of a receiver 122 of the DRAM 101. S_DATA transmitted from the ATE device 110 or the memory controller to the DRAM 101 has the same waveform as that of the curve 201, referred to as an "eye diagram." In the illustrated eye diagram, the x-axis represents time, and the y-axis represents voltage values. One-bit data is transmitted during a time interval from time point (a) to time point (b). In addition, a signal value of a logic low voltage level is determined as value (d), and a signal value of a logic high voltage level is determined as value (c).

Referring to FIG. 2A, a test of detecting an error of 1-bit data signal S_DATA may be started at the time point (a). Image 210 represents a result of the test.

The error checker and counter 115 measures the waveform of the data signal detected by and output from the DRAM 101 over the entire interval. Therefore, the test is started at time point (a) and performed by changing a time point (measuring time) and a voltage value by very small values.

For example, it may be assumed that a cycle of a 1-bit data signal is 450 ps (pico seconds). By shifting the applied clock by 5 ps, for example, the entire waveform interval of the data signal S_DATA is observed. The period of 450 ps is observed by intervals of 5 ps, so that an observation time point is shifted 90 times. In other words, by continuously changing the clock phase, clock signal S_CLK is output. In addition, in response to the clock signal S_CLK applied by the ATE device 110, the error checker and counter 115 observes the waveform in the time-axis direction of the data signal S_DATA.

Assuming that amplitude of the data signal S_DATA is 100 mV, the ATE device 110 outputs the data signal S_DATA, including an offset voltage signal, by shifting the voltage by 2 mV.

FIG. 2B is a view illustrating an intermediate measuring process of the device in FIG. 1B.

Referring to FIG. 2B, the ATE device 110 delays applying the clock signal by an interval obtained by subtracting time point (a) from time point (e). The ATE device 110 shifts the offset voltage value to point (f) to observe the waveform of the data signal.

FIG. 2C is a view illustrating the last measuring process of the device in FIG. 1B.

Referring to FIG. 2C, when measuring is performed on the last portion of the one-cycle data signal waveform, a waveform as illustrated in image 230 is measured. Specifically, when data in the shape of the eye diagram is transmitted, the waveform having similar or the same shape is represented in the image 230, so that it is determined that a corresponding bit of a corresponding semiconductor device is normal.

By magnifying the image 230, it can be seen that a fine eye diagram shown by curve 270 is output, indicating a normal test. The ATE device 110 delays the clock signal by a very small value at time points 271, 272 and 273, to be applied. In addition, by changing the offset voltage from values 281, 282 and 283 by very small amounts to be applied to the data signal S_DATA, the test is performed.

As described above, in order to measure the bit error rate of the semiconductor device, the clock must be applied while delicately shifting the time interval. In addition, the applied time interval must be a very small value, such as 5 ps, exemplified above. When a very small value is applied as the time interval, the more accurate eye diagram can be obtained, and the more accurate test can be performed.

However, for the time sweep of the clock signal, the ATE device having a very small interval has high costs, and it is difficult to transmit multi-phase clock signals. In addition, for mount measurements, a test between the memory controller and the DRAM is required.

SUMMARY OF THE INVENTION

According to an aspect of the present invention, there is provided a clock generating apparatus including a clock generator and a controllable delay line. The clock generator receives an external clock signal and generates multiple clock signals having different phases by delaying the external clock signal. The controllable delay line receives one of the multiple clock signals as a first internal clock signal and delays the first internal clock signal by a first interval in response to an externally applied control signal. The delayed first internal clock signal is input to the clock generator.

The controllable delay line may be connected between an output for the first internal clock signal of the clock generator and an input of the clock generator to form a feedback path. The controllable delay line may be activated in a bit error rate test mode set by a user, and the control signal may be a signal applied by a user in the bit error rate test mode. Thus, the present invention may provide a clock generator capable of performing a bit error rate test.

The control signal may be input by degrees using a thermometer code. Also, a delay amount of the controllable delay line may be linearly increased by the first interval.

The clock generator may include a delay line having multiple delay cells for incrementally delaying the external clock signal by a predetermined amount and outputting multiple delay signals. The clock generator may also include a phase interpolator for outputting the multiple clock signals having different phases and a clock signal synchronized with a data signal, based on the delay signals output from the delay line. The controllable delay line may receive the clock signal synchronized with the data signal as the first internal clock signal.

According to another aspect of the invention, there is provided a clock generating apparatus including a clock generator and a controllable delay line. The clock generator receives an external clock signal and outputs multiple multi-phase clock signals by delaying an internal clock signal with reference to the external clock signal. The controllable delay line, which is connected to an input end of the clock generator, delays the external clock signal by a first interval in response to an externally applied control signal and outputs the delayed signal to the input end of the clock generator.

BRIEF DESCRIPTION OF THE DRAWINGS

The embodiments of the present invention will be described with reference to the attached drawings, in which.

DETAILED DESCRIPTION OF THE EMBODIMENTS

Figure 1A:
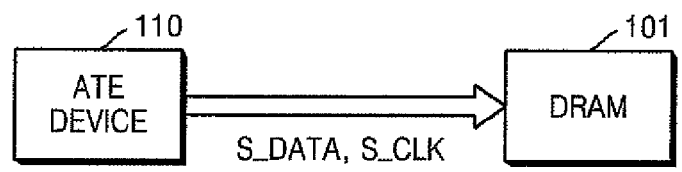
FIG. 1A is a block diagram illustrating a conventional device for measuring a bit error rate.
Figure 1B:
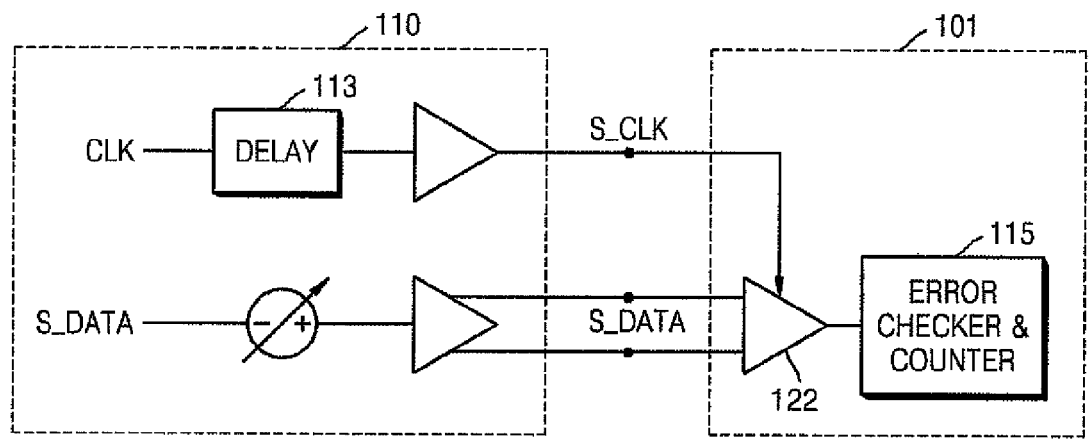
FIG. 1B is a block diagram illustrating the measuring device of FIG. 1A in detail.
Figure 2A:
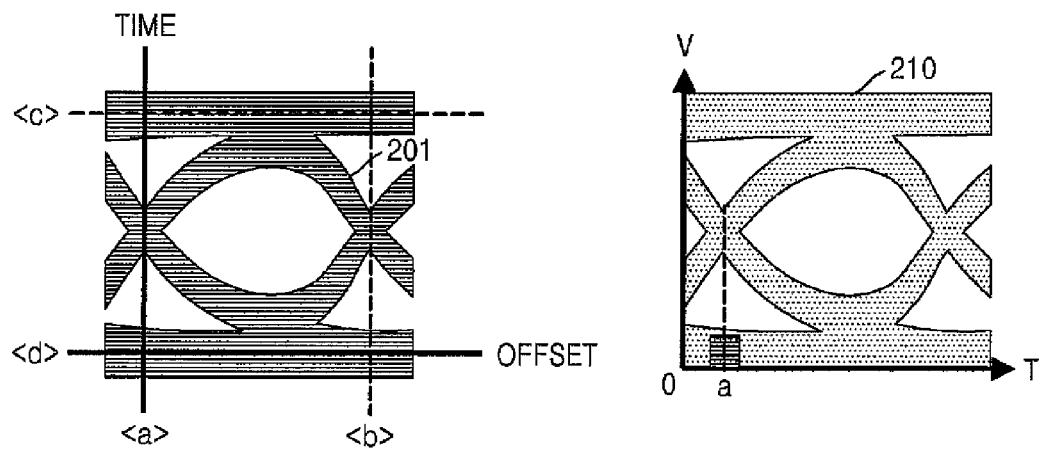
FIG. 2A illustrates an initial measuring process of the device in FIG. 1B.
Figure 2B:
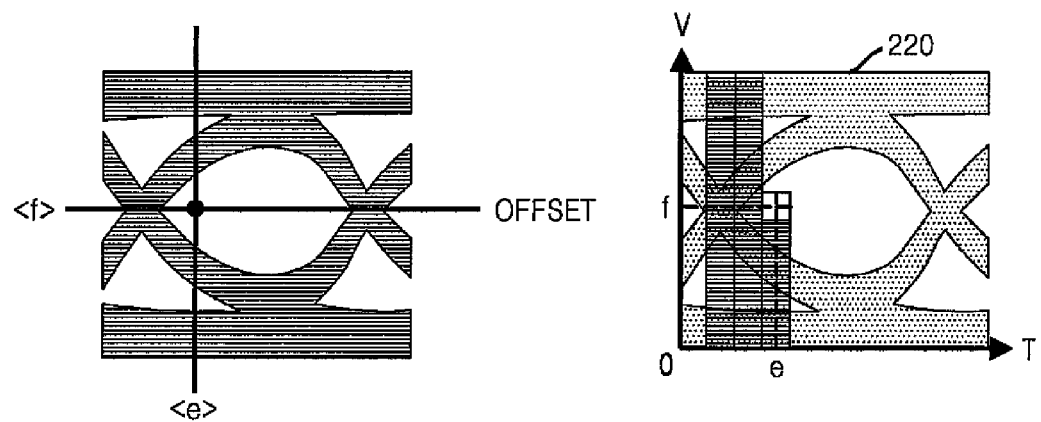
FIG. 2B illustrates an intermediate measuring process of the device in FIG. 1B.
Figure 2C:
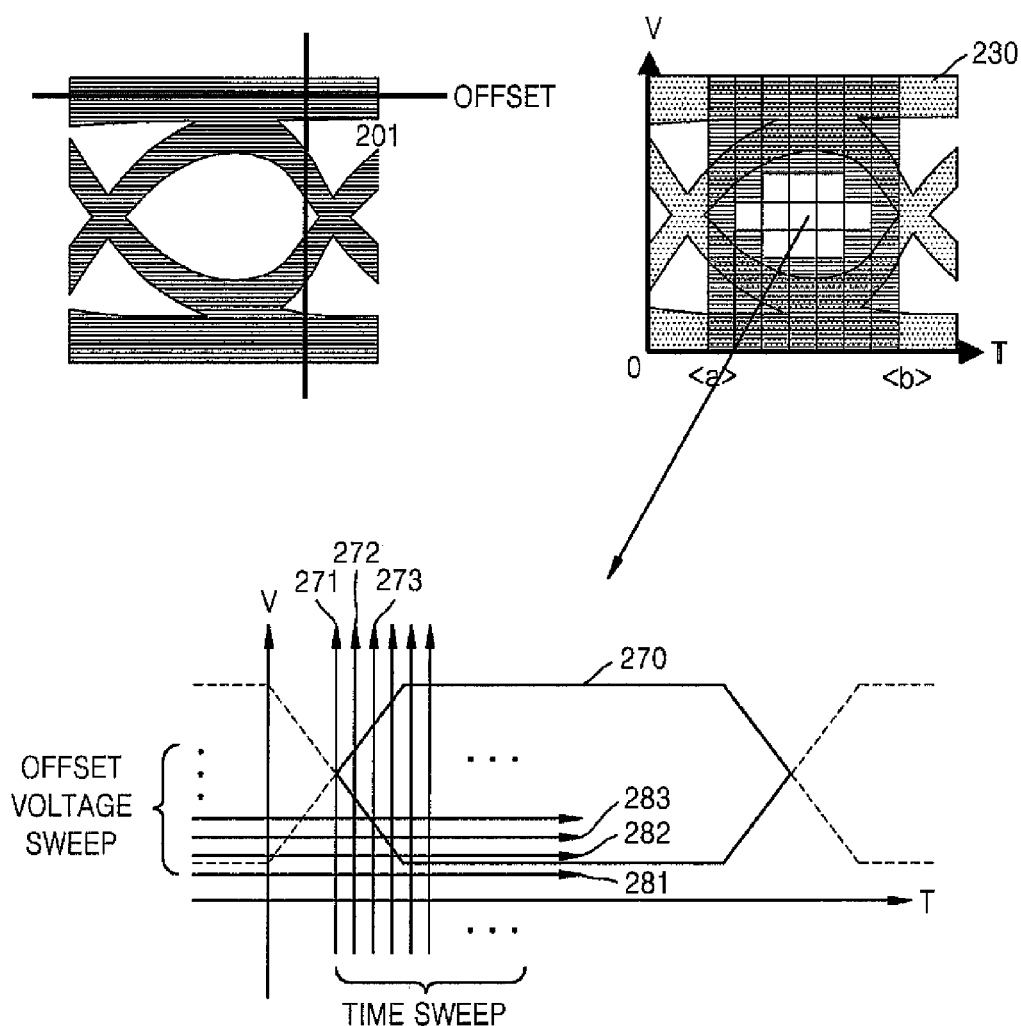
FIG. 2C illustrates a final measuring process of the device in FIG. 1B.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Densities and operating speeds of semiconductor devices have increased. A single data rate (SDR) synchronous dynamic random access memory (SDRAM) outputs 1-bit data per clock cycle, and a double data rate (DDR) SDRAM outputs 2-bit data per clock period. However, for high-speed signal processing and transmission, outputting four or more bits of data per clock cycle is required. Accordingly, a quad data rate (QDR) structure for outputting 4-bit data per clock period or an octal data rate (ODR) structure for outputting 8-bit data per clock period is needed. A semiconductor device having a QDR or ODR structure includes a multi-phase clock generator.

Figure 3:
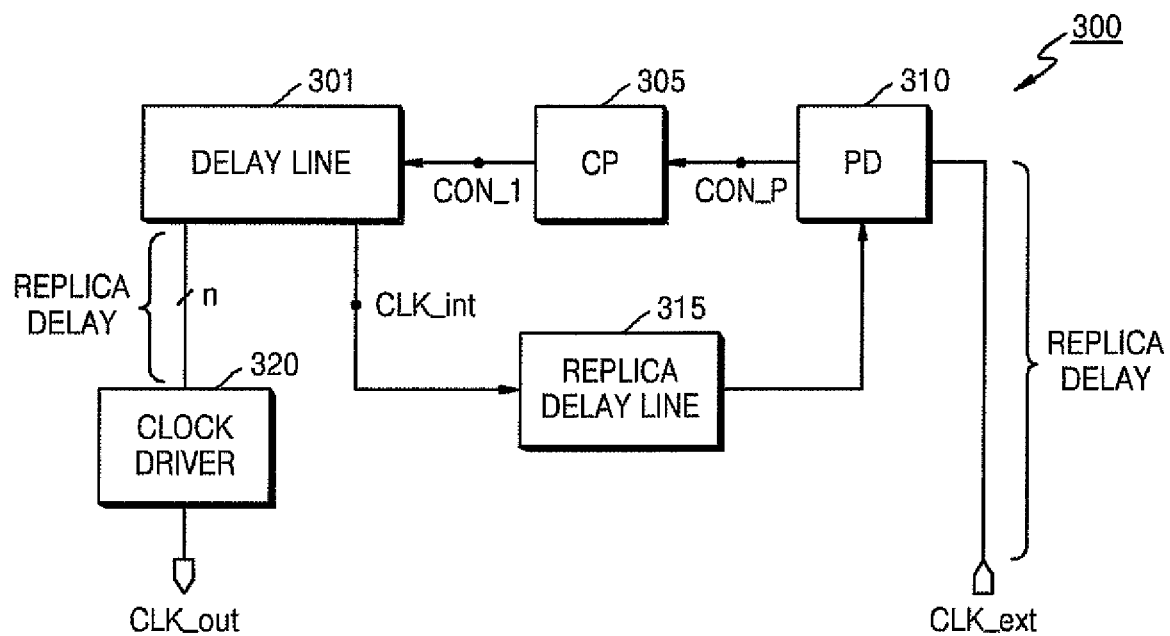
FIG. 3 is a block diagram illustrating a general clock generating apparatus.

FIG. 3 is a block diagram illustrating a general clock generating apparatus.

Referring to FIG. 3, general clock generating apparatus includes a delay line 301, a charge pump 305, a phase detector 310, a replica delay line 315 and a clock driver 320. The phase detector 310 compares a phase of an internal clock signal CLK_int output through the replica delay line 315 with a phase of an external clock signal CLK_ext. The phase detector 310 also outputs a phase control signal CON_P, corresponding to a difference between the phases of the internal clock signal CLK_int and the external clock signal CLK_ext, to the charge pump 305.

The charge pump 305 outputs a first control signal CON_1 for controlling the delay line 301 to have a delay amount corresponding to the detected phase difference, in response to the phase control signal CON_P. The delay line 301 delays the internal clock signal CLK_int by a predetermined amount (the delay amount corresponding to the phase difference detected by the phase detector 310) in response to the first control signal CON_1. In addition, the delay line 301 outputs n multi-phase clock signals having predetermined phase intervals, using a phase interpolator included in the delay line 301. The clock driver 320 drivers and outputs the clock signals output from the delay line 301.

The replica delay line 315 compensates for delay of a signal generated by transmitting the external clock signal CLK_ext from an external circuit to the phase detector 310. In addition, the replica delay line 315 compensates for a delay of a signal generated by transmitting the signal from the delay line 301 to the clock driver 320. Therefore, the replica delay is determined by adding the signal delay amount that occurs between the external circuit and the phase detector 310 and the delay amount of the clock driver 320.

The general clock generating apparatus 300 illustrated in FIG. 3 generates multi-phase clock signals. However, the general clock generating apparatus 300 cannot easily maintain intervals between the output multi-phase clocks. In other words, linearity cannot be guaranteed. For example, when four multi-phase clock signals are output, a phase difference between the clock signals must be exactly 90°. However, the interval may not be exactly 90°, but may be smaller or larger than 90°.

In addition, the general clock generating apparatus 300 cannot continuously generate clock signals having very small time intervals, unlike the ATE device illustrated in FIG. 1A. Also, for mount measurement, the clock generating apparatus 300 requires a test between a memory controller and a DRAM. In this case, it is difficult for the memory controller to control the multi-phase clock signals to move with the very small intervals. Therefore, for the close test, controlling a phase of a clock of a receiver (for example, the DRAM) is required.

Figure 4A:
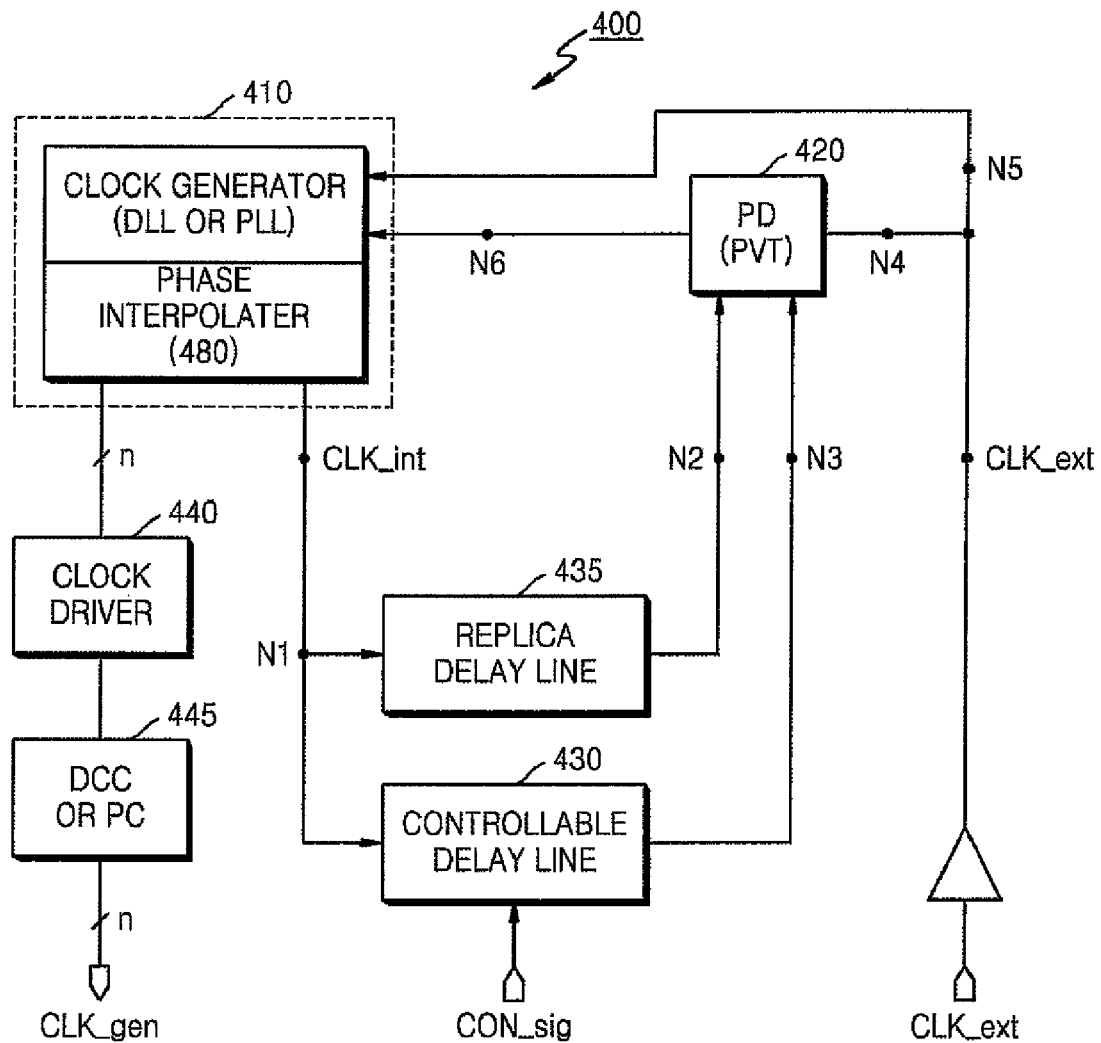
FIG. 4A is a block diagram illustrating a clock generating apparatus, according to an exemplary embodiment of the present invention.
Figure 4A:
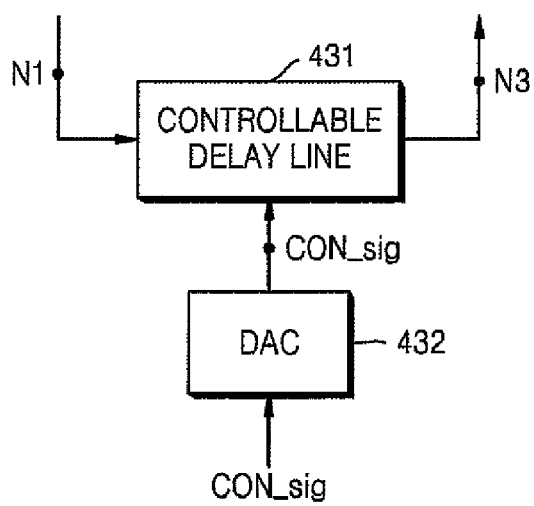

FIG. 4A is a block diagram showing a clock generating apparatus, according to an exemplary embodiment of the present invention.

Referring to FIG. 4A, clock generating apparatus 400 according to the exemplary embodiment includes clock generator 410, phase detector 420 and controllable delay line 430. Clock driver 440 and duty cycle corrector (DCC) or phase corrector (PC) 445 may further be included. The clock generator 410 may include delay look loop (DLL) or phase lock loop (PLL) architecture, for example.

Operations of the clock generating apparatus 400 illustrated in FIG. 4A will be described with reference to FIG. 4B.

Figure 4B:
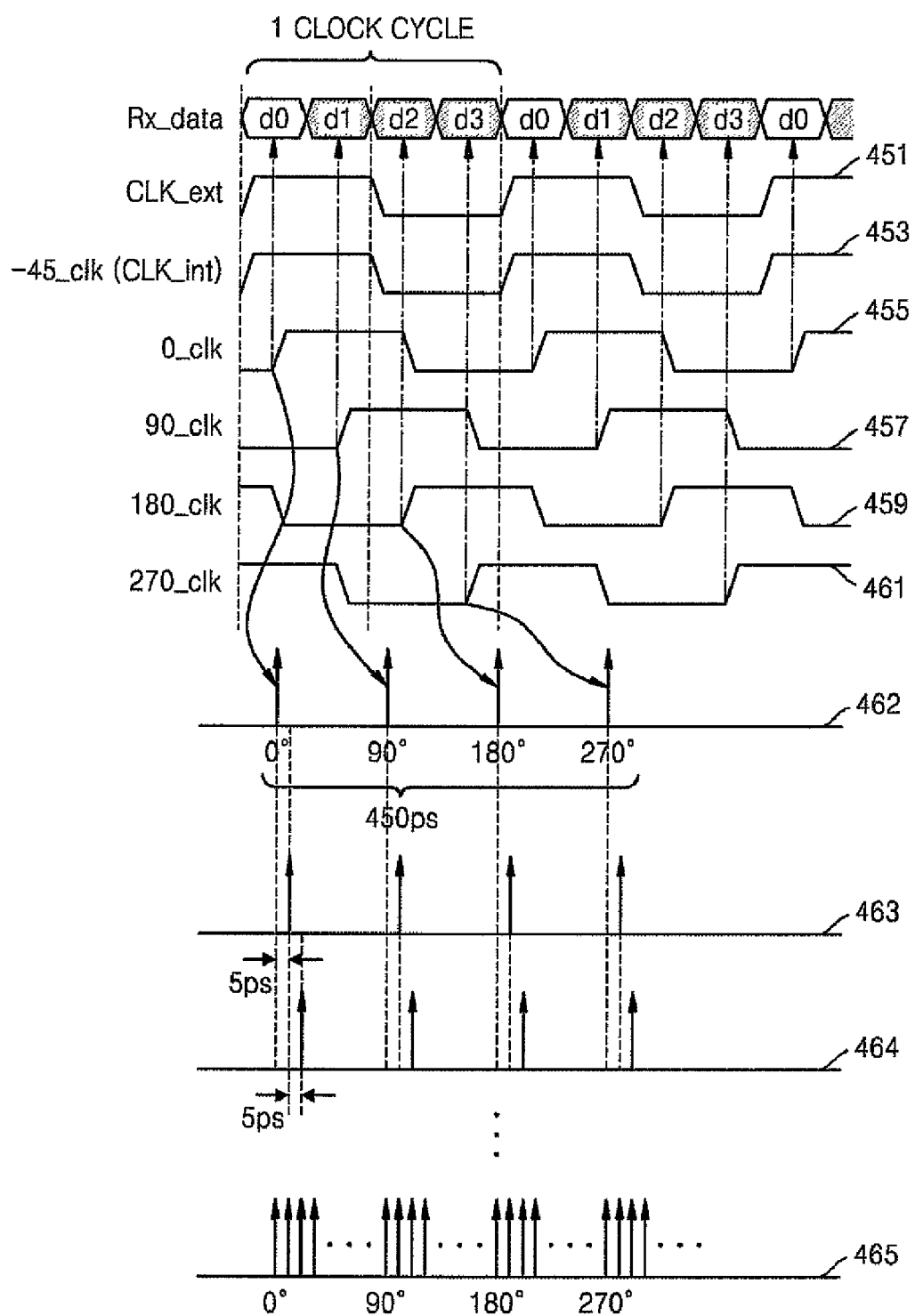
FIG. 4B is illustrates a data signal and various clock signals of FIG. 4A, according to an exemplary embodiment of the present invention.

FIG. 4B is a timing diagram illustrating a data signal, an external clock signal, a first internal clock signal and multi-phase clock signals, which are input to and output from the clock generating apparatus 400. In FIG. 4B, it is assumed that the clock generating apparatus 400 outputs four multi-phase clock signals having different phases, as an example. In addition, it is assumed that the clock generating apparatus 400 has a QDR structure for outputting four multi-phase clock signals.

The phase detector 420 compares phases of an external clock signal CLK_ext with an internal clock signal that is fed back as input, and outputs a control signal corresponding to a difference between the phases to the clock generator 410. The external clock signal CLK_ext is detected by fourth node N4 before the external clock signal CLK_ext is input to the phase detector 420. In addition, the input internal clock signal CLK_int is detected by second node N2 or third node N3 through replica delay line 435 or controllable delay line 430, respectively.

The phase detector 420 is thus able to detect phase difference in consideration of external process, voltage, temperature (PVC) variations, and the like. More specifically, the phase detector 420 detects a phase difference that may change according to various conditions, such as applied voltage, temperature and manufacturing process.

Hereinafter, an internal clock signal detected by first node N1 is referred to as a first internal clock signal CLK_int. The clock generator 410 delays the external clock signal CLK_ext by the phase difference detected by the phase detector 420 to output a phase-delayed first internal clock signal CLK_int. The phase-delayed first internal clock signal CLK_int has the same phase as the external clock signal CLK_ext. In other words, the first internal clock signal CLK_int tracks the external clock signal CLK_ext.

In addition, n multi-phase clock signals having predetermined intervals and different phases from each other are output. As described above, for example, n may be equal to four for a QDR structure.

Referring again to FIG. 4B, four units of data (e.g. 4-bit data) d0, d1, d2 and d3 are transmitted per clock cycle of the external clock signal CLK_ext. Each of the four units of data is synchronized with a predetermined clock signal to be transmitted. Accordingly, data d0 is synchronized with 0° clock signal 0_clk and data d1 is synchronized with 90° clock signal 90_clk, respectively, to be transmitted. Likewise, data d2 and data d3 are synchronized with 180° clock signal 180_clk and 270° clock signal 270_clk, respectively, to be transmitted. The external clock signal CLK_ext is synchronized with data Rx_data and has a 45° leading phase with respect to the 0° clock signal 0_clk, synchronized with the first data d0. Therefore, the first internal clock signal CLK_int tracking the phase of the external clock signal CLK_ext becomes a −45° clock signal −45_clk, likewise having a 45° leading phase with respect to the 0° clock signal 0_clk.

Therefore, the clock generator 410 outputs four multi-phase clock signals 455, 457, 459 and 461 having 90° phase intervals between each of them to transmit four units of data per clock cycle. In the depicted example, because the 360° clock cycle is divided by four, the interval is 90°. Generally, when n multi-phase clock signals are output, the interval between the clocks is 360/n. The first internal clock signal CLK_int and the four multi-phase clock signals are generated using a delay line and a phase interpolator included in the clock generator 410.

Figure 4C:
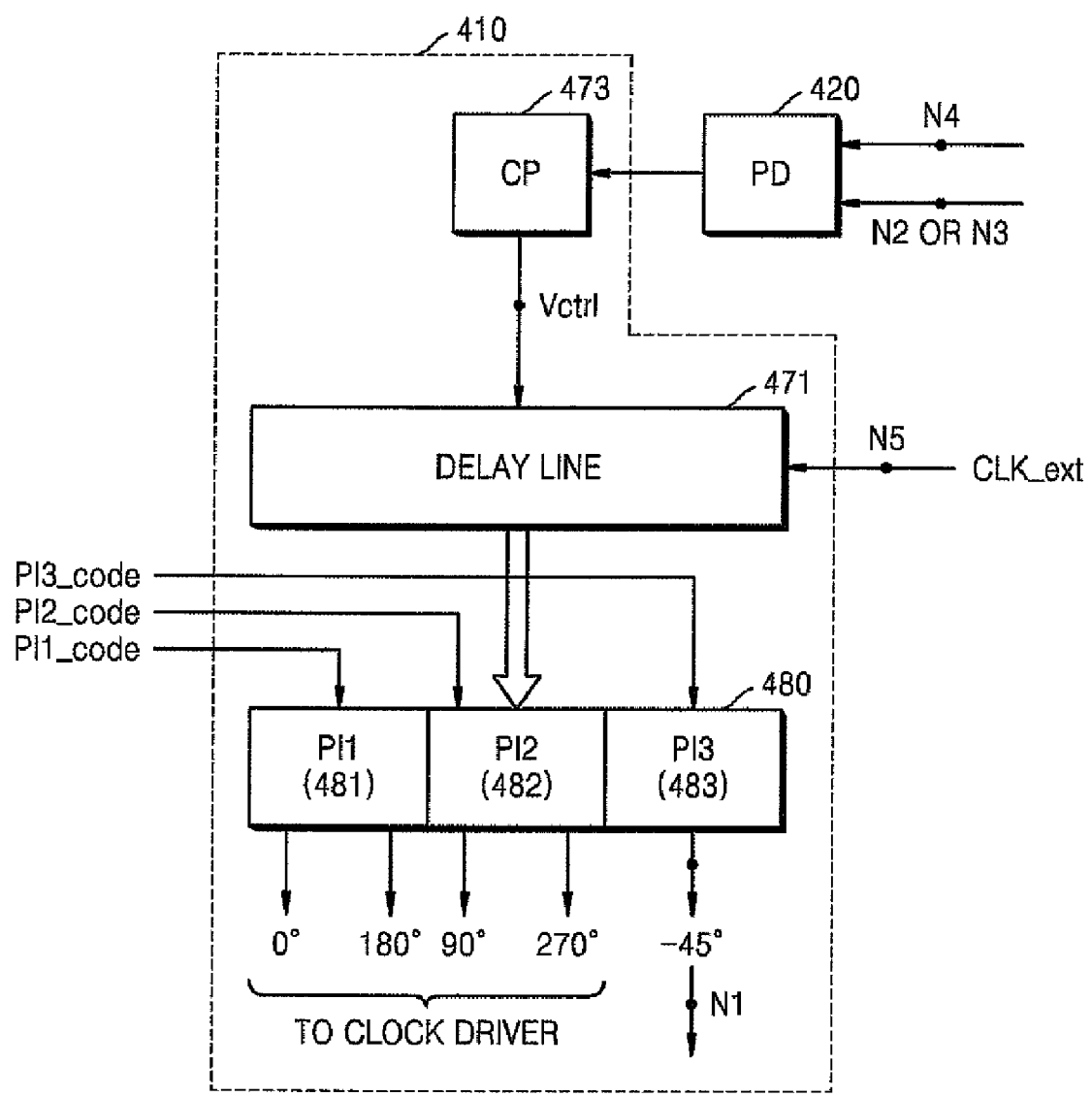
FIG. 4C is a block diagram illustrating a clock generator of FIG. 4A, according to an exemplary embodiment of the present invention.

Referring to FIG. 4C, the clock generator 410 may include a charge pump 473, a delay line 471 and a phase interpolator 480. The charge pump 473 receives phase difference information detected by the phase detector 420 and outputs a first control signal Vctrl for controlling the delay line 471 to have a delay amount corresponding to the phase difference. The delay line 471 will be described with reference to FIG. 6A.

The phase interpolator 480 delays the external clock signal CLK_ext by the delay amount of the first control signal Vctrl to output the first internal clock signal CLK_int (−45° clock signal in FIG. 4C), which is the internal clock signal. Using multiple delayed clock signals (not shown) output from the delay line 471, the phase interpolator 480 generates and outputs multi-phase clock signals, which are phase-interpolated, to the clock driver 440.

More particularly, the phase interpolator 480 included in the clock generating apparatus 400 having an illustrative QDR structure includes a first phase interpolator 481, a second phase interpolator 482 and a third phase interpolator 483. The first phase interpolator 481 outputs clocks signals having 0° and 180° phases using the delay signals output from the delay line 471. The second phase interpolator 482 outputs clock signals having 90° and 270° phases using the delay signals output from the delay line 471. In addition, the third phase interpolator 483 delays the external clock signal CLK_ext by the phase difference detected by the phase detector 420 to output the first internal clock signal CLK_int.

A phase interpolating operation performed by the phase interpolator 480 is performed in response to phase interpolation control signals PI1_code, PI2_code and PI3_code that are externally input. The phase interpolation control signals are signals having values determined according to phases of the output multi-phase clock signals, respectively.

The four multi-phase clock signals of the clock generator 410 are driven by the clock driver 440 to be output. In addition, the clock generator 410 allows the duty cycle corrector (DCC) or the phase corrector (PC) 445 to correct and output multi-phases having duty cycles.

The clock generating apparatus 400, according to the depicted embodiment, includes the controllable delay line 430 in a feedback path for connecting the first internal clock signal CLK_int output by the clock generator 410 and the phase detector 420. The controllable delay line 430 may be activated in a bit error rate (BER) test mode, set by a user, for example.

In addition, the controllable delay line 430 may delay the first internal clock signal CLK_int by a first interval, to be output in response to an externally applied control signal CON_sig. When the control signal CON_sig is a digital signal, the control signal CON_sig may be input by degrees using a thermometer code, for example. The controllable delay line 430 linearly increases the delay amount by the first interval in response to the control signal CON_sig.

For example, it may be assumed that the clock period is 450 ps, and the control signal is input by 90 degrees. Values 00001, 00010, 00011 and 00100 (binary numbers) are sequentially input by degrees as the control signal CON_sig. Accordingly, the controllable delay line 430 has delay amounts of 5 ps, 10 ps, 15 ps, 20 ps, and so on.

More specifically, referring to FIGS. 4A and 4B, multi-phase clock signals initially having phases denoted by reference numeral 462 are output to the clock driver 440. When the control signal having the value 00001 is initially input, the controllable delay line 430 has the delay amount of 5 ps (the first interval), and the first internal clock signal CLK_int is delayed and output. The phase detector 420, receiving a signal through third node N3, detects a phase difference between the clock signal from the third node N3 and the external clock signal CLK_ext. Thereafter, the clock generator 410 delays the external clock signal by the detected phase difference to perform phase-interpolation and outputs multi-phase clock signals having phases denoted by reference numeral 463. Next, the control signal having the value 00010 is input, and the controllable delay line 430 has the delay amount of 5 ps (the first interval), and the first internal clock signal CLK_int is delayed and output. These operations are repeatedly performed.

Referring to FIG. 4B, in response to the control signal CON_sig, very small delays continuously occur, and the multi-phase clock signals having phases denoted by numerals 462, 463 and 464 are sequentially generated. As a result, clock signals having very small time intervals (the first interval), denoted by reference numeral 465, can be continuously output while maintaining linearity.

In other words, the clock generating apparatus 400 according to embodiments of the present invention can continuously output multi-phase clock signals having small time intervals, as denoted by the reference numeral 465, and therefore can perform BER testing using the output multi-phase clock signals. Therefore, clock signals which have small time intervals and maintain linearity can be output without a high-cost ATE device. In addition, the clock generating apparatus 400 that performs the BER test may be included in the DRAM, so that the semiconductor device which includes the DRAM is capable of performing the BER test.

A lower part of FIG. 4A illustrates a circuit diagram of a controllable delay line 431, according to an alternative exemplary embodiment, in which the clock generating apparatus 400 is an analog clock generator.

An analog clock generator is operated by an analog control signal. Therefore, when the digital control signal CON_sig is input, a digital-to-analog (DAC) 432 converts the digital value into an analog value and outputs the converted analog value to the controllable delay line 431. Alternatively, the controllable delay line 431 of the clock generating apparatus 400 may directly receive a control signal CON_sig having an analog value without the DAC 432. Since other components off the analog clock generator are the same as those discussed above with respect to FIG. 4A, discussion of these components will not be repeated.

In an embodiment, the controllable delay line 430 may include delay cells (not shown) of the same type as the delay cells included in the delay line 471. The controllable delay line 430 may be used as a general replica delay line when BER testing is not performed.

In addition, the clock generating apparatus 400 may include an additional replica delay line 435, in parallel with the controllable delay line 430. Functions and operations of the replica delay line 435 would be apparent to one of ordinary skill in the art, and thus will not be described herein.

The number of first to n-th phase interpolators (e.g., 481, 482 and 483) included in the phase interpolator 480 varies according to the number of output multi-phase clock signals, as described above with reference to FIG. 4C.

Figure 4D:
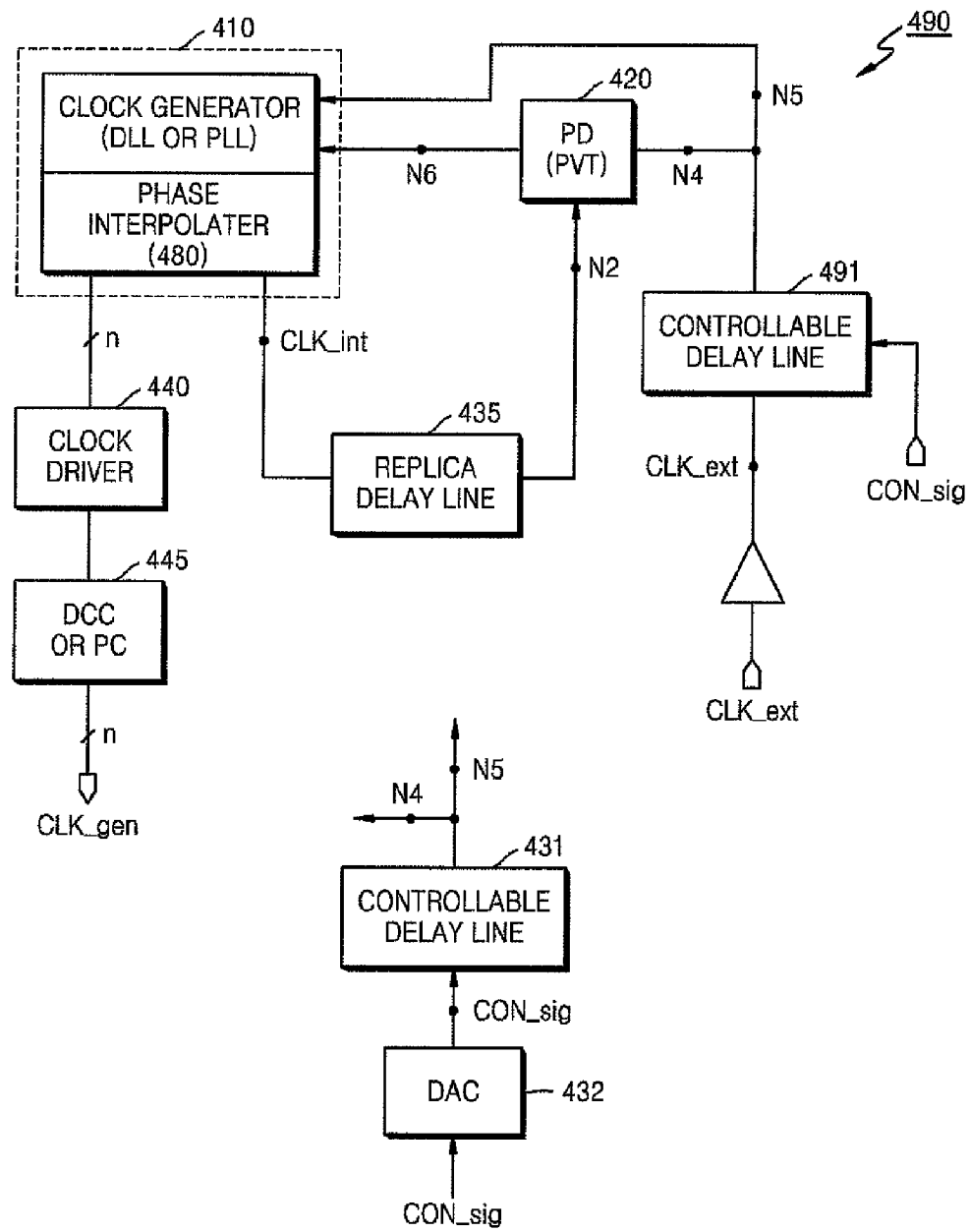
FIG. 4D is a block diagram illustrating a clock generating apparatus, according to another exemplary embodiment of the present invention.

FIG. 4D is a block diagram illustrating a clock generating apparatus, according to another exemplary embodiment of the present invention.

Referring to FIG. 4D, the controllable delay line 430 illustrated in FIG. 4A may be connected as controllable delay line 491 to an input (e.g., through fourth and fifth nodes N4 and N5) of the phase detector 420. Specifically, the controllable delay line 491 may be positioned between the phase detector 420 and an input of the external clock CLK_ext.

Therefore, the controllable delay line 491 illustrated in FIG. 4D receives the external clock signal CLK_ext, and delays and outputs the external clock signal CLK_ext by the first interval in response to the control signal CON_sig. The phase detector 420 detects a phase change corresponding to the first interval and controls the clock generator 410 to have a delay amount of the first interval. The clock generator 410 outputs multi-phase clock signals delayed by the first interval in response to controlling of the phase detector 420.

The control signal CON_sig is continuously input, and the controllable delay line 491 delays and outputs the external clock signal CLK_ext by the first interval in response to the control signal CON_sig. The clock generator 410 then outputs new multi-phase clock signals delayed by the first interval with respect to the multi-phase clock signals output in advance.

Other components shown in FIG. 4D are the same as described above with reference to FIGS. 4A to 4C, and thus discussion of these components will not be repeated.

Figure 5A:
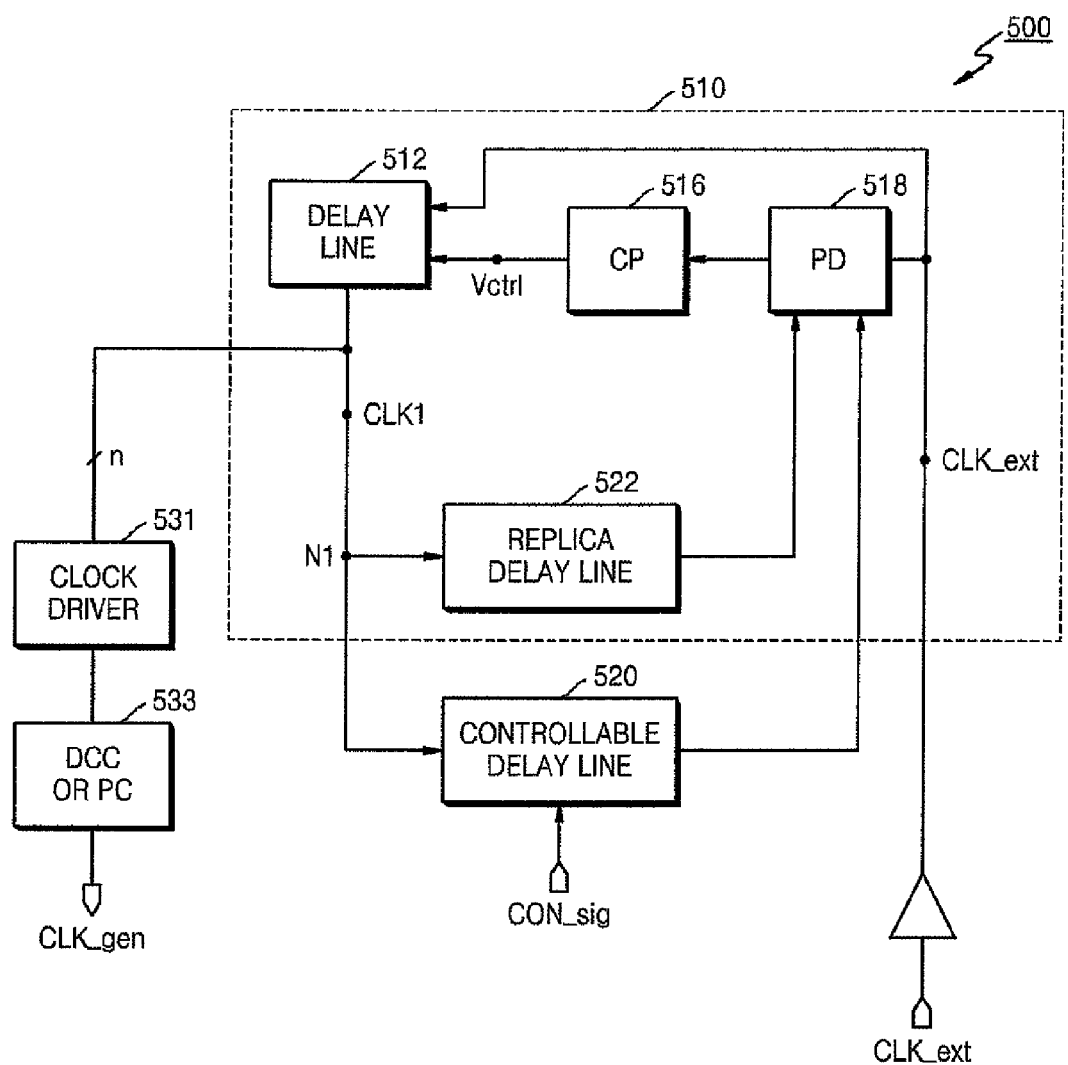
FIG. 5A is a block diagram illustrating a clock generating apparatus, according to another exemplary embodiment of the present invention.

FIG. 5A is a block diagram illustrating a clock generating apparatus, according to another exemplary embodiment of the present invention.

Referring to FIG. 5A, clock generating apparatus 500 invention includes a clock generator 510 and a controllable delay line 520. Alternatively, the controllable delay line 520 may be included in the clock generator 510. The clock generator 510 includes delay line 512, charge pump 516 and phase detector 518. In addition, the clock generating apparatus 500 may further include clock driver 531 or the DCC or PC 533.

The delay line 512 receives an external clock signal CLK_ext and delays the external clock signal by a predetermined amount to output n multi-phase clock signals. As compared with FIG. 4A, the clock generator 510 illustrated in FIG. 5A does not include a phase interpolator (e.g., phase interpolator 480). The delay line 512 outputs the multi-phase clock signals having phases at predetermined intervals. The delay line 512 includes multiple delay cells (described below with reference to FIG. 6). Therefore, in FIG. 5A, without phase-synthesizing, the multi-phase clock signals are output using only the delay cells.

The controllable delay line 520 receives one of the multi-phase clock signals output from the delay line 512 as a first clock signal CLK1. In addition, the controllable delay line 520 delays and outputs the received first clock signal CLK1 by the first intervals in response to an externally applied control signal CON_sig. The controllable delay line 520 has the same operations and construction as discussed above with respect to the controllable delay line 430, illustrated in FIG. 4A.

When a delay corresponding to the first interval occurs in the controllable delay line 520, the phase detector 518 detects the delay and controls the delay line 512 to have a delay amount corresponding to the first interval. Specifically, the phase detector 518 compares phases of the external clock signal CLK_ext with the fed back first clock signal CLK1 and detects a phase difference between the signals. In addition, the phase detector 518 outputs a control signal corresponding to the phase difference to charge pump 516. Therefore, the delay line 512 outputs the multi-phase clock signals delayed by the first interval.

The controllable delay line 520 may operate as a replica delay line when not in the BER test mode, as discussed with respect to FIG. 4A. Alternatively, if the controllable delay line 520 does not operate as the replica delay line, the clock generating apparatus 500 may further include a replica delay line 522.

In FIG. 5A, functions and operations of components other than the delay line 512 are the same as the corresponding components described above with reference to FIGS. 4A to 4C.

Figure 5B:
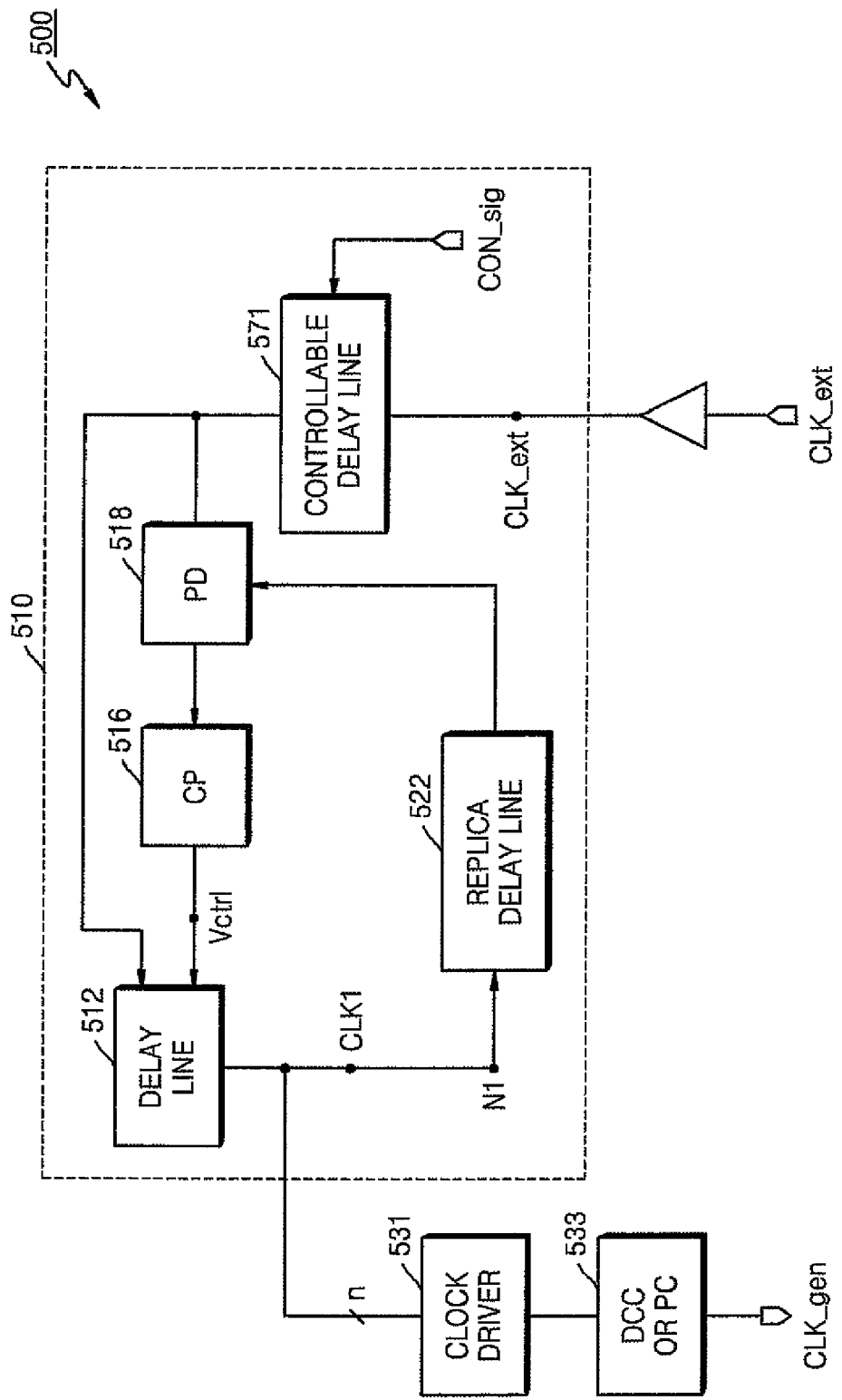
FIG. 5B is a block diagram illustrating a clock generating apparatus, according to another exemplary embodiment of the present invention.

FIG. 5B is a block diagram illustrating a clock generating apparatus, according to another exemplary embodiment of the present invention.

Referring to FIG. 5B, controllable delay line 520 is not included, but controllable delay line 571 is connected to an input end of the phase detector 518. The controllable delay line 571 may be positioned between the input end of phase detector 518 and an external clock signal CLK_ext.

Therefore, the controllable delay line 571 illustrated in FIG. 5B receives the external clock signal CLK_ext, and delays and outputs the external clock signal CLK_ext by a first interval in response to a control signal CON_sig. The phase detector 518 then detects a phase change corresponding to the first interval and controls the delay line 512 to have a delay amount of the first interval and to output multi-phase clock signals. Constructions and functions of the controllable delay line 571 illustrated in FIG. 5B may be the same as those of the controllable delay line 491 illustrated in FIG. 4D, for example. In addition, other components are the same as the corresponding components described above with reference to FIGS. 4A and 4C.

Figure 6A:
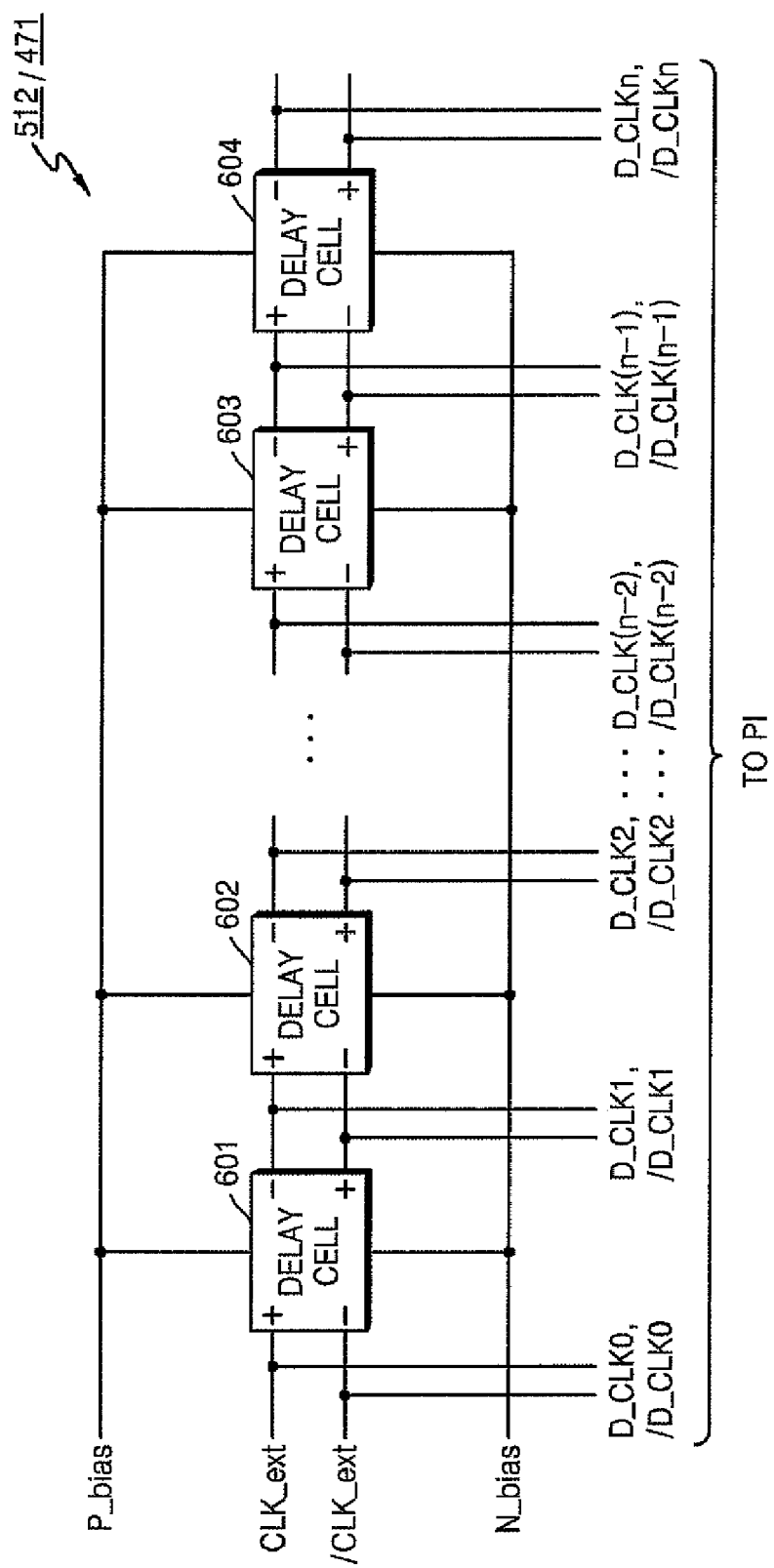
FIG. 6A is a block diagram illustrating a delay line included in the clock generating apparatus of FIG. 4C, 5A or 5B, according to exemplary embodiments of the present invention.

FIG. 6A is a block diagram illustrating a delay line included, for example, in the clock generating apparatuses illustrated in FIGS. 4C, 5A and 5B, according to exemplary embodiments of the present invention.

Referring to FIG. 6A, each of the delay lines 471 and 512 included in the clock generating apparatuses illustrated in FIGS. 4C and 5A/5B, respectively, includes multiple delay cells 601, 602, 603 and 604. The delay cells 601, 602, 603 and 604 may provide the same delay amount, incrementally. Alternatively, the delay cells 601, 602, 603 and 604 may be designed to provide different delay amounts.

The delay cell 601 receives a pair of an external clock signals, external clock signal CLK_ext and inverted external clock signal /CLK_ext, and outputs a corresponding pair of delayed clock signals, delayed clock signal D_CLK1 and inverted delayed clock signal /D_CLK1, generated by delaying the input clock signal(s) by a predetermined amount. An i-th delay cell (for example, the delay cell 603) receives a pair of delay clock signals D_CLK(n−2) and /D_CLK(n−2) output from a preceding delay cell (not shown), and outputs a pair of delayed clock signals D_CLK(n−1) and /D_CLK(n−1) generated by delaying the input pair by a predetermined amount.

In the embodiment shown in FIG. 4C, for example, the delay clock signals D_CLKi and /D_CLKi output from each of the delay cells 601 to 604 may be input to the phase interpolator 480 to be used for phase interpolating. In addition, the clock signals may be output as the multi-phase clock signals.

When the delay line is in a voltage controlled oscillator (VCO) type, for example, output delay clock signals D_CLKn and /D_CLKn of the delay cell 604 connected to an end of the delay line 471 or 512 may be input to an input end of first delay cell 601. That is, a feedback loop may be formed between the final delay cell 604 and the first delay cell 601.

As described above, the delay cells of the controllable delay lines, according to the various embodiments, may be the same type as the delay cells of the delay lines included in the clock generator.

Figure 6B:
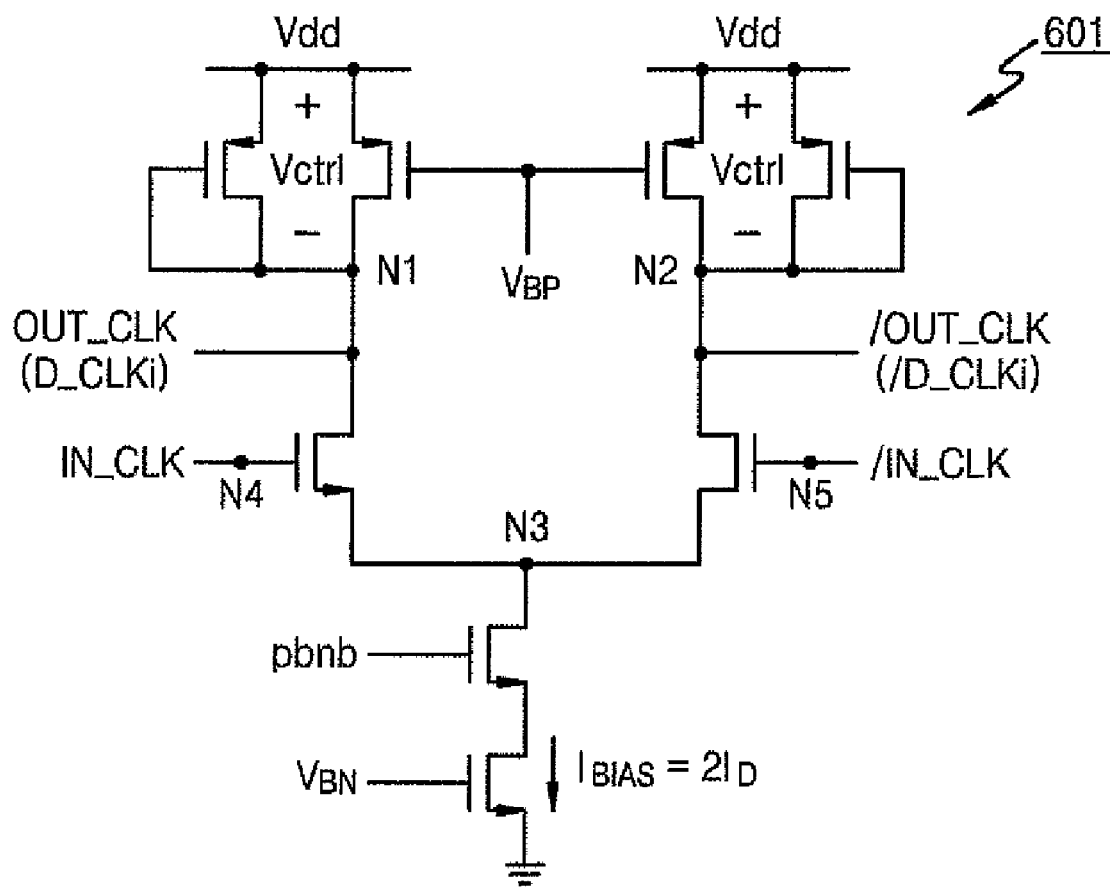
FIG. 6B is a circuit diagram illustrating a delay cell included the delay line of FIG. 6A, according to exemplary embodiments of the present invention.

FIG. 6B is a circuit diagram illustrating the delay cell included the delay line illustrated in FIG. 6A, according to an exemplary embodiment of the present invention.

Referring to FIG. 6B, a delay cell (for example, the delay cell 601 of FIG. 6A) may include multiple metal oxide semiconductor (MOS) transistors. A voltage $V_{BP}$ is an externally applied voltage used to control a voltage value applied between first node N1 and voltage Vdd to be voltage Vctrl. The voltage Vctrl becomes a control voltage signal Vctrl output from the charge pump (e.g., 473, 516) illustrated in FIG. 4C, 5A or 5B, for example.

A voltage pbnb and the voltage $V_{BN}$ have difference values according to a delay amount determined by the charge pump. Therefore, the voltages have different values to be input according to the delay amount.

The input end of the delay cell 601 includes fourth and fifth nodes N4 and N5, and the output end includes first and second nodes N1 and N2. In the delay cell 601, illustrated input clock signals IN_CLK and /IN_CLK are the external clock signals CLK_ext and /CLK_ext, respectively, illustrated in FIG. 6A. In addition, output clock signals OUT_CLK and /OUT_CLK are the delayed clock signals D_CLK1 and /D_CLK1, respectively, illustrated in FIG. 6A. The delay cell 601 illustrated in FIG. 6B uses a principle on which a delay time occurs until the output signals are output after the input signals are input.

It is understood that the delay cells included in the clock generating apparatus according to the various exemplary embodiments are not limited to the delay cell illustrated in FIG. 6B, but may include any type of compatible delay cells.

Figure 7:
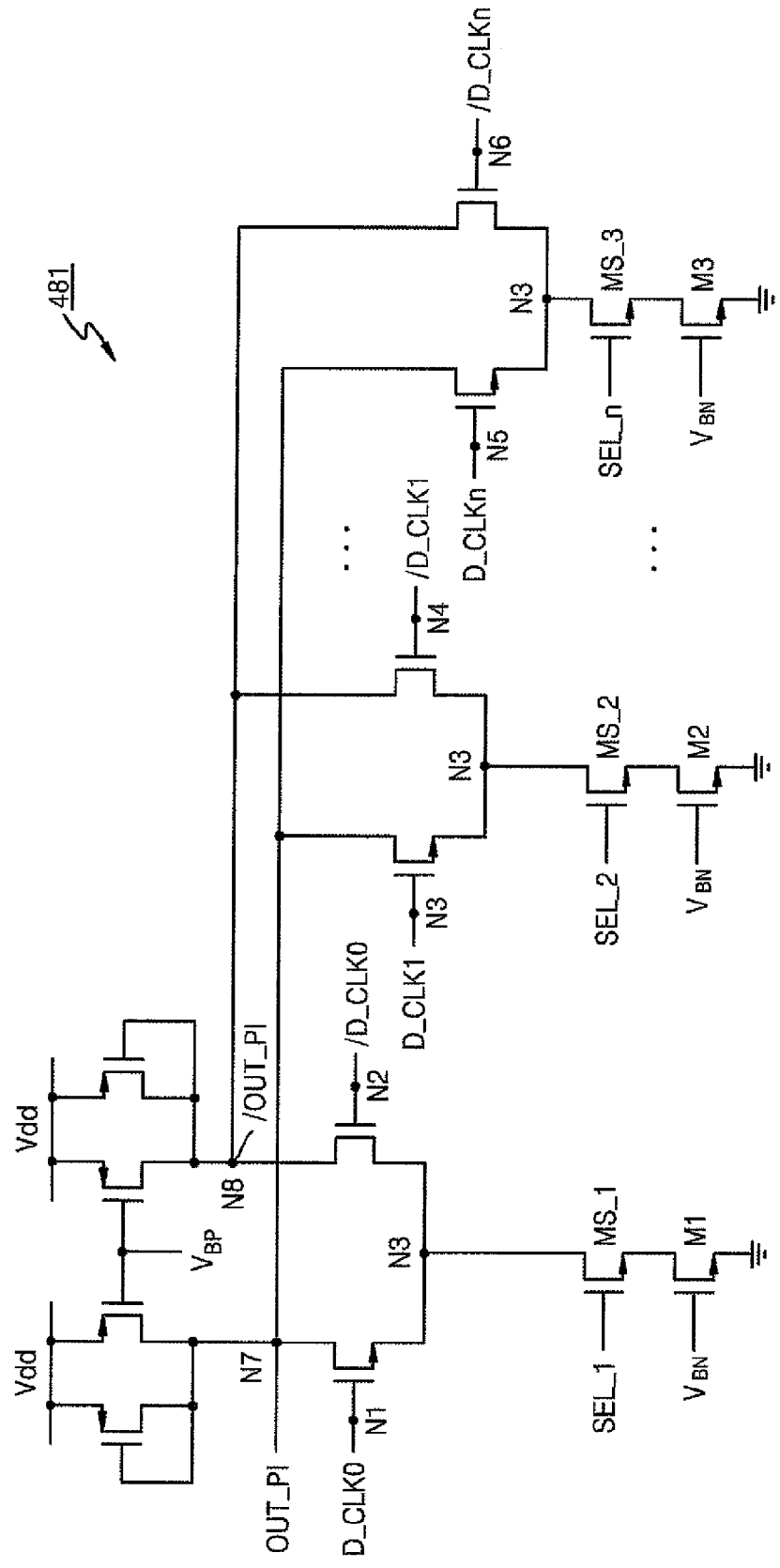
FIG. 7 is a circuit diagram illustrating a phase interpolator included in the clock generating apparatus of FIGS. 4A-4D, according to exemplary embodiments of the present invention.

FIG. 7 is a circuit diagram illustrating a phase interpolator, included in the clock generating apparatus illustrated in FIG. 4A to 4D, according to exemplary embodiments of the present invention. In FIG. 7, in particular, illustrates the first phase interpolator 481 shown in FIG. 4C, as an example.

Delay clock signals D_CLK0 and /D_CLK0 to D_CLKn and /D_CLKn respectively output from each of the delay cells 601, 602, 603 and 604 illustrated in FIG. 6A are input to input terminals N1, N2, N3, N4, N5 and N6 of the first phase interpolator 481. In addition, output signals OUT_PI and /OUT_PI become signals 0_clk and 180_clk of the first phase interpolator 481, respectively.

The voltage signal $V_{BP}$ is a signal for enabling a voltage applied between seventh node N7 and the voltage Vdd to have a particular value (for example, the voltage Vctrl), as illustrated in FIG. 6B. Selection signals SEL_1, SEL_2, . . . and SEL_n are values input according to the phase interpolation control signals PI1_code, PI2_code and PI3_code, respectively, described with reference to FIG. 4C, and control turn-on and turn-off operations of transistors MS_1, MS_2 and MS_3 according to phase-interpolated and output values. The signal $V_{BN}$ is a value input according to the phase interpolation control signals PI1_code, PI2_code and PI3_code, and controls turn-on and turn-off operations of transistors M1, M2 and M3, respectively, according to phase-interpolated and output values.

It is understood that the phase interpolator included in the clock generating apparatus according to the various embodiments is not limited to the phase interpolator illustrated in FIG. 7, but may include any type of compatible interpolator.

As described above, the clock generator according to various exemplary embodiments of the present invention allows the controllable delay line to delicately control the delay amount of the internal clock signal in response to a control signal. The delay line and the phase interpolator then output multi-phase clock signals with respect to the internal clock signal delayed by a small amount. Therefore, multi-phase clock signals, which continuously maintain linearity and have small intervals, may be continuously output.

As described above, the clock generator according to the various embodiments of the present invention can output multi-phase clock signals having delicately controlled delay amounts. In addition, BER testing may be performed without the need for high-cost ATE devices.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A clock generating apparatus comprising:
a clock generator for receiving an external clock signal and generating a plurality of clock signals having different phases by delaying the external clock signal;
a controllable delay line for receiving one of the plurality of clock signals as a first clock signal and delaying the first clock signal by a first interval in response to an externally applied control signal, the delayed first clock signal being input to the clock generator; and
a replica delay unit for compensating for a delay that occurs until the external clock signal is input to the clock generator, the replica delay unit being connected to the controllable delay line in parallel.

2. The apparatus of claim 1, wherein the controllable delay line is connected between an output for the first clock signal of the clock generator and an input of the clock generator to form a feedback path, and is activated in a bit error rate test mode set by a user.

3. The apparatus of claim 2, wherein the control signal comprises a signal applied by the user in the bit error rate test mode.

4. The apparatus of claim 3, wherein the control signal is input by degrees using a thermometer code, and
wherein a delay amount of the controllable delay line is linearly increased by the first interval.

5. The apparatus of claim 2, wherein, when the clock generating apparatus is not in the bit error rate test mode, the controllable delay line is not activated and does not receive the control signal, and
wherein the controllable delay line operates as a replica delay circuit for compensating for a delay that occurs until the external clock signal is input to the clock generator.

6. The apparatus of claim 1, wherein the clock generator comprises:
a delay line comprising a plurality of delay cells for incrementally delaying the external clock signal by a predetermined amount and outputting a plurality of delay signals; and
a phase interpolator for outputting the plurality of clock signals having different phases and a clock signal synchronized with a data signal, based on the plurality of delay signals output from the delay line, and
wherein the controllable delay line receives the clock signal synchronized with the data signal as the first clock signal.

7. The apparatus of claim 6, wherein each of the controllable delay line and the delay line comprises the same type of delay cells.

8. The apparatus of claim 6, further comprising:
a phase detector for comparing phases of the external clock signal and the first clock signal delayed by passing through the delay line, detecting a difference between the phases, and outputting a signal comprising information on the detected phase difference; and
a charge pump for receiving the signal output from the phase detector and outputting a first control signal in response to the received signal,
wherein the first control signal controls the delay line to have a delay amount corresponding to the detected phase difference.

9. The apparatus of claim 8, wherein the phase detector compares the phases of the external clock signal and the first clock signal and detects the difference between the phases in consideration of process, voltage and temperature variations.

10. The apparatus of claim 1, wherein the clock generator comprises a delay line comprising a plurality of delay cells, the delay cells incrementally delaying the external clock signal by a predetermined amount to output the plurality of clock signals having different phase, and
wherein the controllable delay line receives one of the plurality of clock signals having different phases as the first clock signal, and delays the first clock signal by the first interval in response to the control signal.

11. The apparatus of claim 10, further comprising:
a phase detector for comparing phases of the external clock signal and the first clock signal delayed by passing through the delay line to detect a difference between the phases and outputting a signal having information on the detected phase difference; and a charge pump for receiving the signal output from the phase detector and outputting a first control signal in response to the received signal, wherein the first control signal is a signal for controlling the delay line to have a delay amount corresponding to the detected phase difference.

12. The apparatus of claim 10, wherein the delay line comprises n delay cells connected in series, a first delay cell receiving the external clock signal, delaying the external clock signal by the predetermined amount and outputting the delayed signal, and an n-th delay cell receiving an output signal from an (n−1)-th delay cell, delaying the output signal by the predetermined amount, and outputting the delayed signal.

13. The apparatus of claim 10, wherein the delay line comprises n delay cells connected in series, a first delay cell receiving an output signal from an n-th delay cell, delaying the received signal by the predetermined amount and outputting the delayed signal, and the n-th delay cell receiving an output signal from an (n−1)-th delay cell, delaying the received signal by the predetermined amount and outputting the delayed signal to an input terminal of the first delay cell.

14. The apparatus of claim 1, wherein the clock generating apparatus is analog and further comprises:

a digital-to-analog converter connected to the controllable delay line, the digital-to-analog converter converting the control signal to an analog value and outputting the analog value to the controllable delay line, wherein the controllable delay line delays the first clock signal by the first interval in response to the control signal converted to the analog value.

15. The apparatus of claim 1, wherein the control signal has an analog value, and the controllable delay line delays and outputs the first clock signal by the first interval in response to the control signal having the analog value.

16. The apparatus of claim 6, wherein the clock generator outputs four multi-phase clock signals, and wherein the phase interpolator comprises:

a first phase interpolator for outputting clock signals having phases of 0° and 180° using signals output from the delay cells;

a second phase interpolator for outputting clock signals having phases of 90° and 270° using the signals output from the delay cells; and a third phase interpolator for outputting the first clock signal having a phase of 45° to be synchronized with the data signal using the signals output from the delay cells.

17. A clock generating apparatus comprising:

a clock generator for receiving an external clock signal and outputting a plurality of multi-phase clock signals by delaying an internal clock signal with reference to the external clock signal; and a controllable delay line, connected to an input end of the clock generator, for delaying the external clock signal by a first interval in response to an externally applied control signal and for outputting the delayed signal to the input end of the clock generator, wherein the clock generator comprises:

a delay line comprising a plurality of delay cells for incrementally delaying the external clock signal by a predetermined amount and outputting a plurality of delayed clock signals;

a phase interpolator for outputting the plurality of multi-phase clock signals based on the plurality of delayed clock signals from the delay line;

a phase detector for comparing phases of the external clock signal and the internal clock signal to detect a difference between the phases and outputting a signal having information on the detected phase difference; and a charge pump for receiving the signal output from the phase detector and outputting a first control signal for controlling the delay line to have a delay amount corresponding to the detected phase difference.

18. The apparatus of claim 17, wherein the controllable delay line is activated in a bit error rate test mode set by a user, and wherein the control signal comprises a signal applied by the user in the bit error rate test mode.

19. The apparatus of claim 18, wherein the control signal is input by degrees using a thermometer code, and wherein a delay amount of the controllable delay line is linearly increased by the first interval.

20. The apparatus of claim 17 wherein the clock generator outputs four multi-phase clock signals, and wherein the phase interpolator comprises:

a first phase interpolator for outputting clock signals having phases of 0° and 180° using signals output from the delay cells;

a second phase interpolator for outputting clock signals having phases of 90° and 270° using the signals output from the delay cells; and a third phase interpolator for outputting the first clock signal that has a phase of 45° to be synchronized with a data signal using the signals output from the delay cells.

21. The apparatus of claim 17, wherein the controllable delay line is not activated when the clock generating apparatus is not in a bit error rate test mode, and the controllable delay line operates as a replica delay circuit for compensating for a delay that occurs until the external clock signal is input to the clock generator.

22. The apparatus of claim 17, wherein the clock generating apparatus is an analog clock generating apparatus and further comprises:

a digital-to-analog converter, connected to the controllable delay line, for converting the controllable signal into an analog voltage value to output the analog voltage value to the controllable delay line, and wherein the controllable delay line delays the internal clock signal by the first interval in response to the controllable signal converted to the analog voltage value.

23. The apparatus of claim 17, wherein the delay line comprises a plurality of delay cells, and wherein each delay cell delays the internal clock signal by a predetermined amount with respect to the external clock signal to output the plurality of multi-phase clock signals.

* * * * *